United States Patent
Bansal

(10) Patent No.: US 8,045,353 B2
(45) Date of Patent: Oct. 25, 2011

(54) INTEGRATED CIRCUIT CAPABLE OF OPERATING AT DIFFERENT SUPPLY VOLTAGES

(75) Inventor: Nitin Bansal, Gurgaon (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 1075 days.

(21) Appl. No.: 11/645,815

(22) Filed: Dec. 26, 2006

(65) Prior Publication Data

US 2007/0170451 A1 Jul. 26, 2007

(30) Foreign Application Priority Data

Dec. 30, 2005 (IN) .......................... 3535/DEL/2005

(51) Int. Cl.
*H02M 1/00* (2007.01)
(52) U.S. Cl. ...................................... 363/147
(58) Field of Classification Search .............. 363/147; 323/268, 266, 277; 716/10; 326/37, 38; 365/226

See application file for complete search history.

(56) References Cited

U.S. PATENT DOCUMENTS

| | | | | |
|---|---|---|---|---|
| 3,819,960 A | * | 6/1974 | Kohn et al. | 327/518 |
| 5,440,244 A | * | 8/1995 | Richter et al. | 326/37 |
| 5,757,170 A | * | 5/1998 | Pinney | 323/266 |
| 5,828,205 A | * | 10/1998 | Byrne | 323/268 |
| 5,996,102 A | * | 11/1999 | Haulin | 714/740 |
| 6,149,319 A | * | 11/2000 | Richter et al. | 713/300 |
| 6,600,220 B2 | * | 7/2003 | Barber et al. | 257/685 |
| 6,646,475 B2 | * | 11/2003 | Steinecke | 326/101 |
| 6,677,809 B2 | * | 1/2004 | Perque et al. | 327/541 |
| 6,693,413 B1 | * | 2/2004 | Lanni | 323/297 |
| 6,714,050 B2 | * | 3/2004 | McClintock et al. | 326/83 |
| 6,865,682 B1 | * | 3/2005 | Talbot et al. | 713/300 |
| 6,903,581 B2 | * | 6/2005 | Clark et al. | 327/112 |
| 6,909,266 B2 | * | 6/2005 | Kernahan et al. | 323/282 |
| 6,970,367 B2 | * | 11/2005 | Takeshima et al. | 363/147 |
| 7,245,148 B2 | * | 7/2007 | Awalt et al. | 326/38 |
| 7,411,853 B2 | * | 8/2008 | Liu et al. | 365/226 |
| 7,568,177 B1 | * | 7/2009 | Soebroto et al. | 716/120 |
| 2001/0005129 A1 | * | 6/2001 | Renous | 323/274 |
| 2004/0208032 A1 | * | 10/2004 | Edo et al. | 363/147 |
| 2006/0190894 A1 | * | 8/2006 | Jwalant et al. | 716/10 |

\* cited by examiner

*Primary Examiner* — Adolf Berhane
*Assistant Examiner* — Yemane Mehari
(74) *Attorney, Agent, or Firm* — Lisa K. Jorgenson; James H. Morris; Wolf, Greenfield & Sacks, P.C.

(57) ABSTRACT

A chip configuration for dual board voltage compatibility comprising ballast I/O pads, regulator control block and VDDCO pad. If 1.8V is available on board, all 1.8V pads are connected to the package pins and the VDDCO pad is double bonded with one 1.8V package pin. This ensures that the regulator is in operation providing 1.2V supply to the core. If 1.2V is available on board, all 1.2V pads are bonded to the package pins and VDDCO pad is left unbonded. A weak pulldown ensures that the regulator is inoperational and the gate voltage of ballast transistor is pulled up. Now 1.2V pads directly get supply from the board through package pins and is provided to the core without suffering IR drop.

19 Claims, 4 Drawing Sheets

1.2V supply to core

INTEGRATED CIRCUIT CAPABLE OF OPERATING AT DIFFERENT SUPPLY VOLTAGES

BACKGROUND OF THE INVENTION

1. Field of the Invention

The instant invention relates to Integrated circuit capable of operating at different supply voltages.

2. Discussion of the Related Art

The trend in chip design is towards shrinking geometries. As part of this trend the gate length of a MOSFET, which is the distance between the source and the drain regions underneath the gate region, is also reducing. These shrinking digital CMOS gate lengths, necessitate corresponding reduction in the operating voltages. This change calls for lowering of board supply voltages in order to prevent punchthrough, breakdown and hot-carrier related problems. However, board supply voltages cannot be reduced easily owing to interfaces to external devices.

An on-chip voltage regulator is often the solution to incompatibility with board voltage. In this approach a regulator is used to step down the external board supply to the required chip operating voltage. The on-chip voltage regulators have a dropout voltage equal to the difference between the external board supply and chip operating voltage. This helps address the board supply compatibility issue for the core operating voltages. When the lower board voltages are made available in newer board design the regulator is operated in bypass mode, wherein all the current is passed through a fully-on NMOS/PMOS. This approach has an inherent problem of voltage drop across the switch, which may be unacceptable in high current consuming cores operating at low voltage levels around 1V. To avoid this, a new chip without the regulator is required to be fabricated which is very costly.

FIG. 1 illustrates the ballast transistor (11) implementation in one I/O pad (10). Vg (14) is the gate control voltage coming from a control block. One terminal (15) of the PMOS ballast (11) is connected to the 1.8V pad (12) and other terminal to the 1.2V pad (13).

SUMMARY OF THE INVENTION

It is an object of the invention to obviate the above drawbacks and make a single fabricated chip operate in older boards as well as new boards without change in board configuration.

It is also an object of this invention to make a single fabricated chip operate in older boards as well as new boards without the need to re-fabricate chip.

Another object of this invention is to make a single fabricated chip for dual board voltages without the problem of IR drop in pass transistor.

Still another object of the invention is to make testing of the core possible in case of incorrect load regulation of regulator or when regulator gives incorrect voltage.

To achieve the above objects the invention provides a digital integrated circuit having selectable supply voltage compatibility comprising:
core logic,
a core logic supply voltage bus connected to said core logic,
a low-voltage supply input pad connected to said core logic supply voltage bus,
one or more digitally switch able ballast devices having an input end connected to a specific high-voltage supply input pad and its output end connected to said core logic supply voltage bus,
a control block associated with each said ballast device, having a control input connected to said specific high-voltage supply input pad and its output connected to the control input of the corresponding ballast device,
the arrangement being such that when one of said specific high-voltage supply input pads is connected to the input supply with all other supply input pads being left unconnected, then the corresponding ballast device is enabled and provides a supply voltage reduced to the corelogic operating voltage level to the core logic, while when the input supply is connected to said low-voltage supply input pad and all said specific high-voltage supply input pads are left unconnected then all said ballast devices are disabled and the input supply voltage is directly fed to the core logic supply bus.

Further the present invention provides a method for providing a selectable supply voltage capability to an integrated circuit, comprising the steps of:
providing a low-voltage supply input pad directly connected to the internal core logic supply bus,
providing one or more digitally-switchable ballast devices having an input connected to a specific high-voltage supply input pad and an output connected to the core logic supply,
providing a control unit associated with each said ballast device having its control input connected to said specific high-voltage supply input pad and its output connected to the control input of said digitally-switched ballast device, and
connecting the input supply to either a selected one of said specific high-voltage supply input pads when the input supply is higher than the core logic supply voltage or alternatively, feeding the input supply to said low-voltage supply input pad when the input supply is equal to the core logic supply voltage.

BRIEF DESCRIPTION OF THE DRAWINGS

An embodiment of the present invention is described with the help of following drawings.

DETAILED DESCRIPTION

Figure 1:
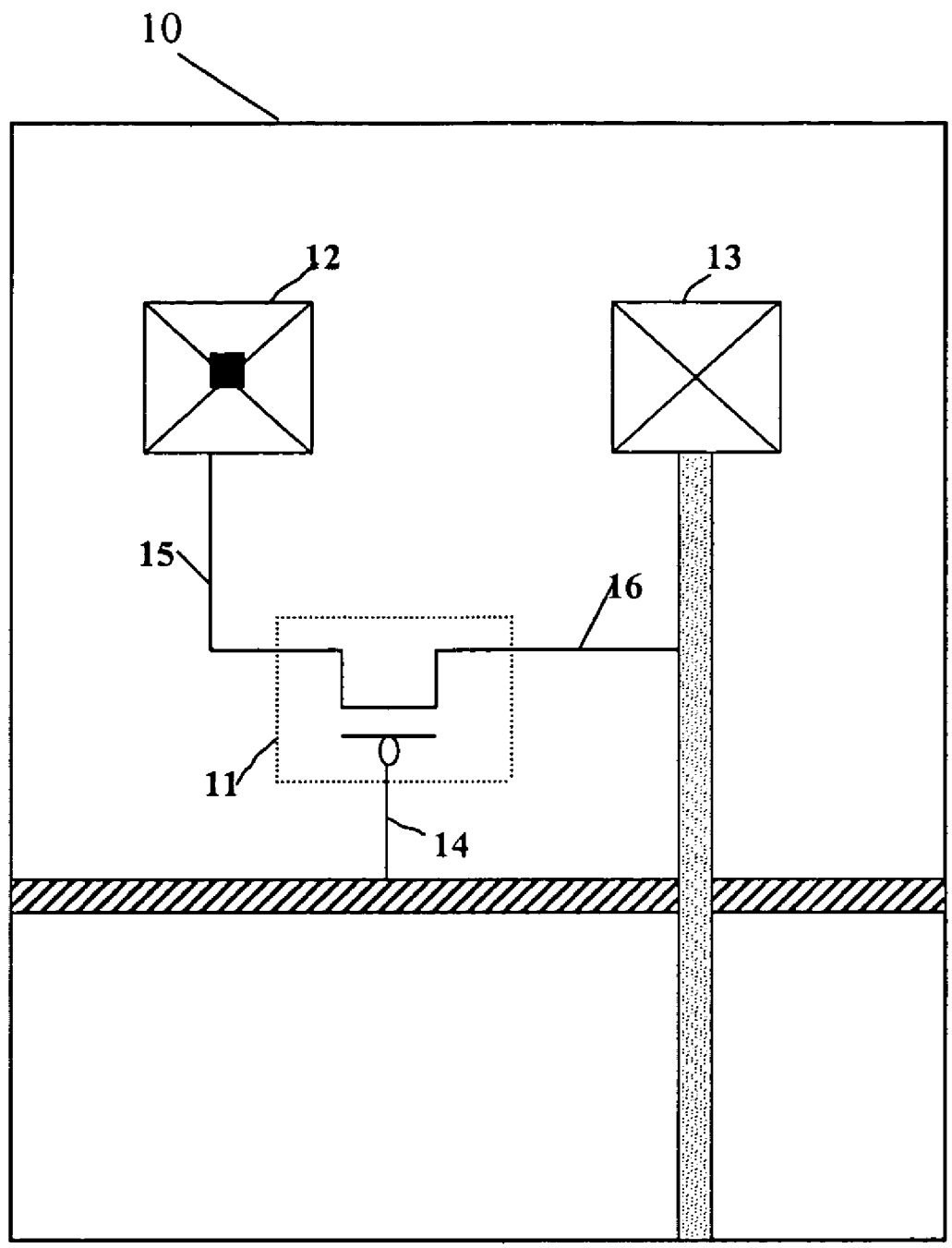
FIG. 1 shows the ballast transistor implementation in one I/O pad.
Figure 2:
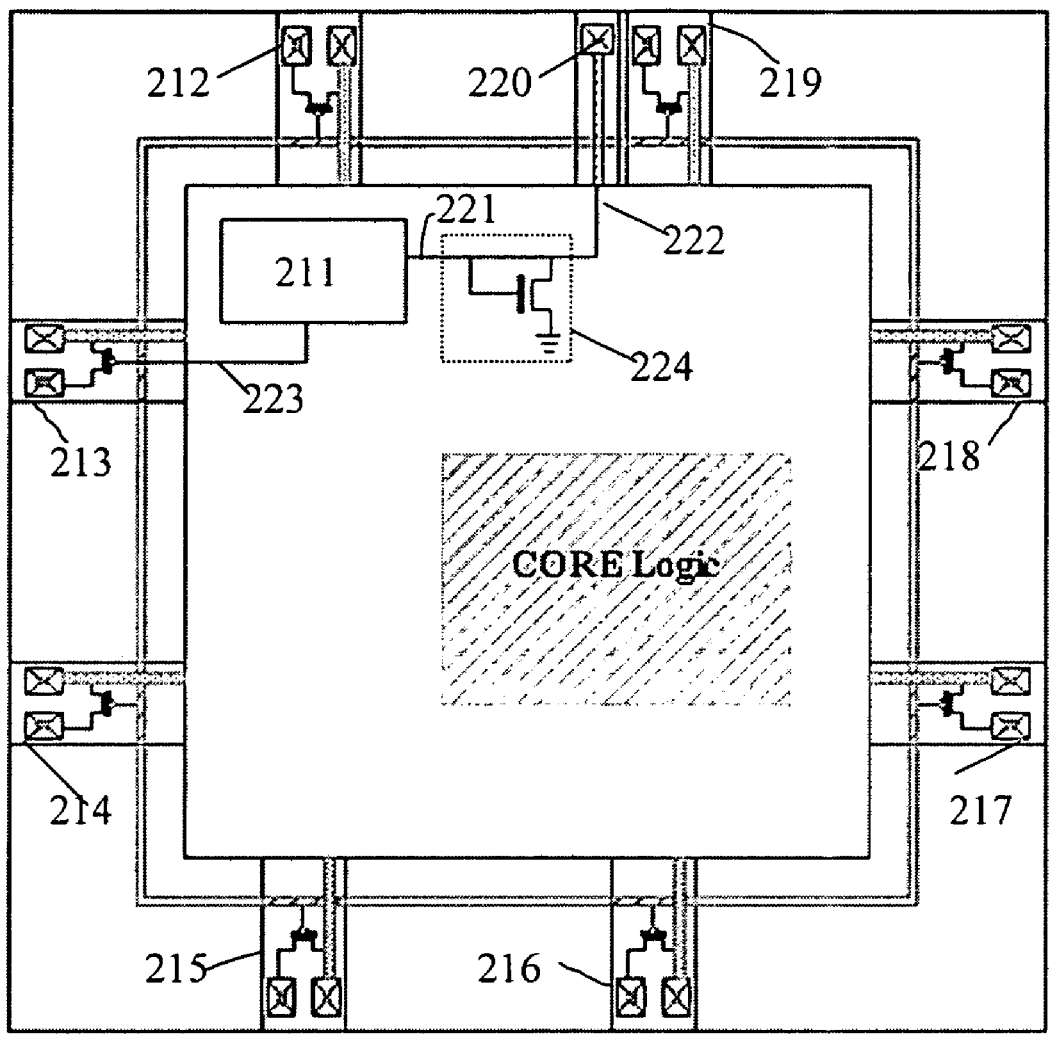
FIG. 2 shows the chip I/O ring implementation method.

FIG. 2 illustrates the chip I/O ring implementation method. For a board voltage of 1.8V a control block (211) is used to step down form 1.8V to 1.2V core operating voltage. 8 ballast I/Os (212,213,214,215,216,217,218,219) are also shown. A VDDCO pad (220) is also inserted in the I/O ring. The VDDCO pad (220) core side pin (222) is connected to the enable input (221) of the control block (211). The control block (211) is so designed such that when enable (221) is low, the control block (211) is switched off and the ballast transistor gate control voltage Vg (223) is pulled high so that the ballast transistor is switched-off. When the enable pin (221) is pulled high the control block (211) is activated and the voltage Vg (223) controls the load voltage and current. A weak pull down (224) is placed at enable signal (221) coming from VDDCO pad (220) to ensure that signal is low when VDDCO signal (222) is floating.

Figure 3:
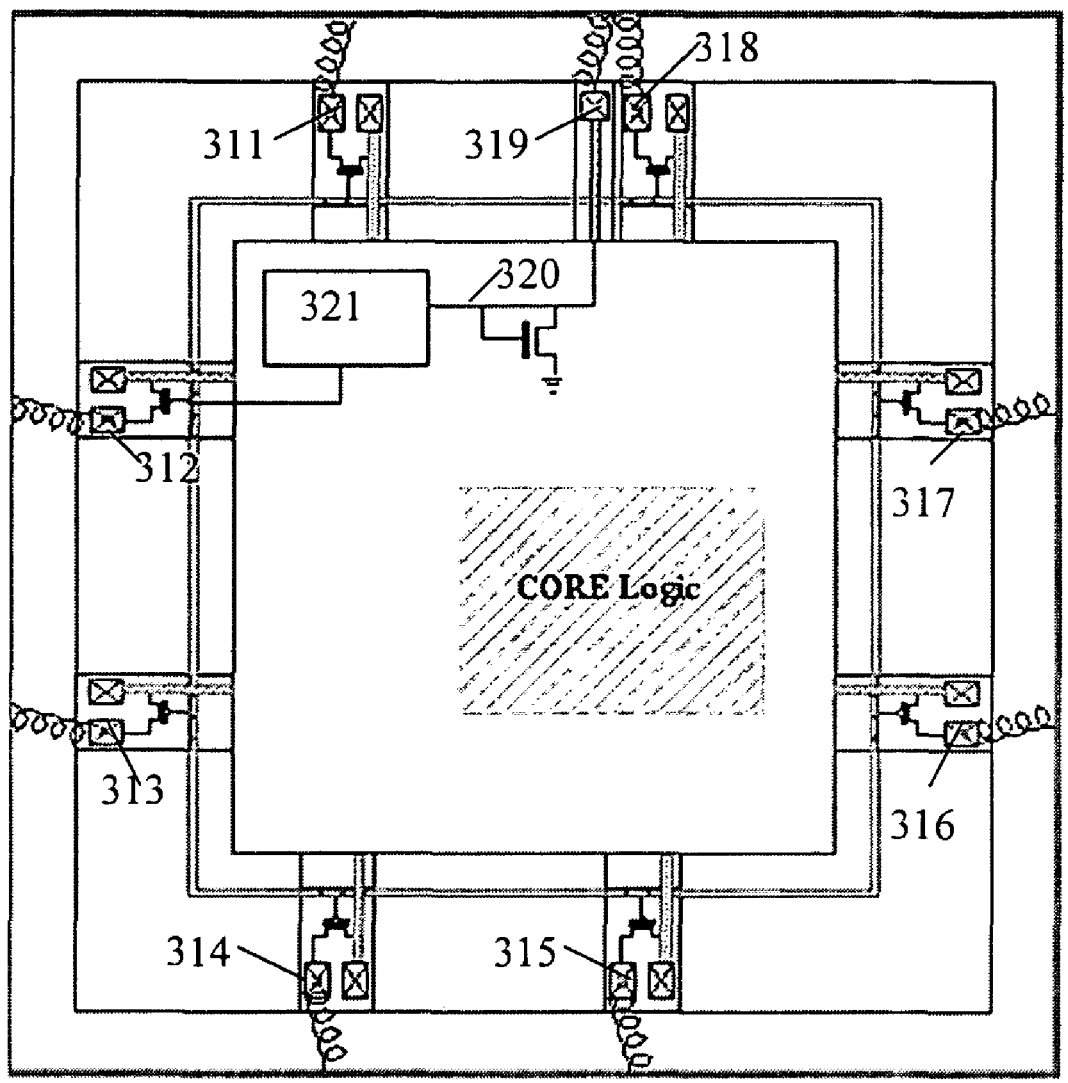
FIG. 3 shows the bonding diagram when 1.8V is available on board.

FIG. 3 shows the bonding for the chip when 1.8V is available on board. All 1.8V pads (311, 312, 313, 314, 315, 316, 317, 318) are connected to the package pins and the VDDCO pad (319,320) is double bonded with one 1.8V package pin. This ensures that the enable pin (320,221) is high and the regulator (321,211) is in operation providing 1.2V regulated supply to the core.

Figure 4:
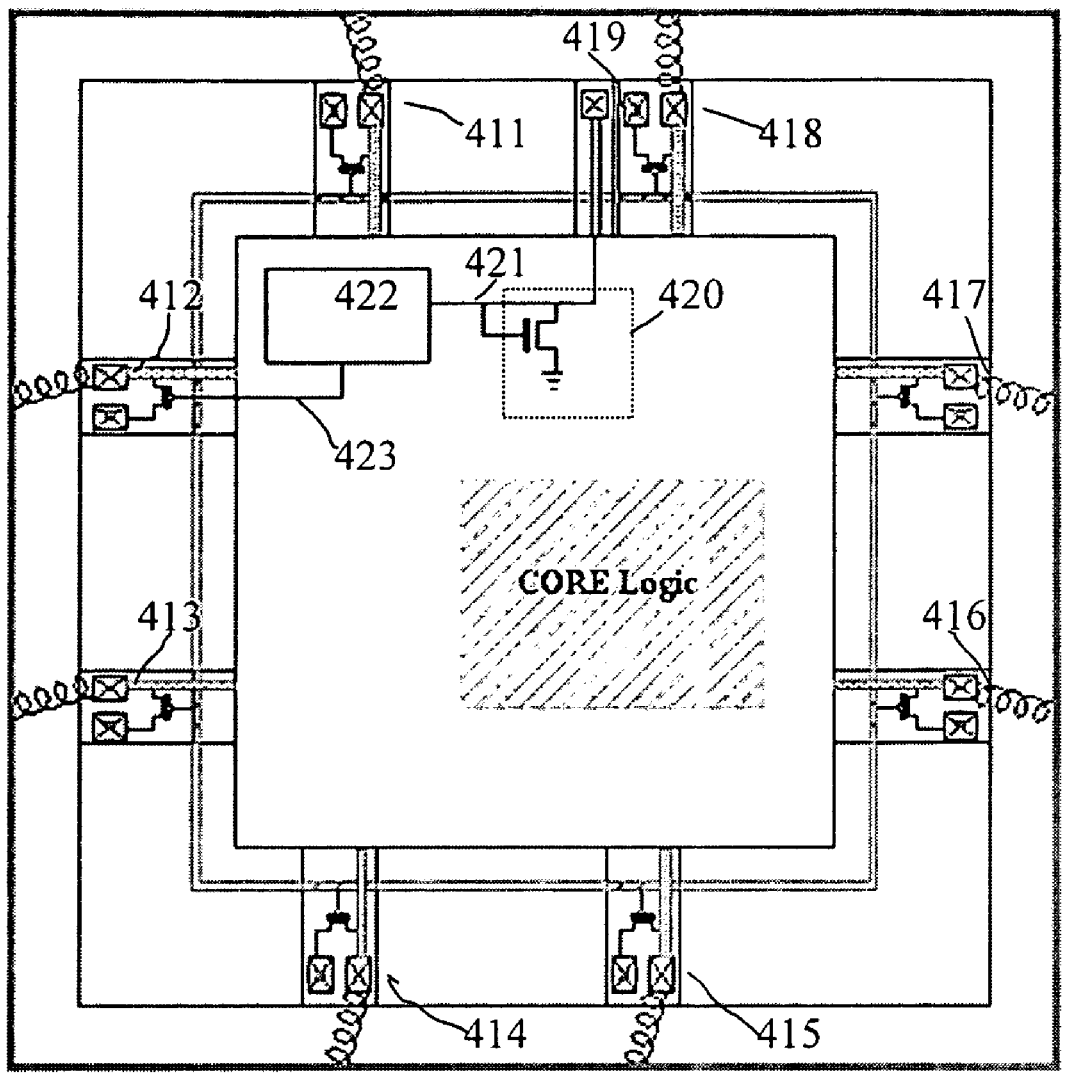
FIG. 4 shows the bonding diagram when 1.2V is available on board.

FIG. 4 illustrates the bonding diagram when 1.2V is available on board. All 1.2V pads (411, 412, 413, 414, 415, 416, 417, 418) are bonded to the package pins and VDDCO pad (419, 319, 220) is left unbonded. The weak pulldown (420, 224) ensures that the enable pin (421, 320, 221) is not floating and is pulled down to ground. This makes the regulator (422, 321,211) inoperational and gate voltage Vg (423) is pulled up. Now 1.2V pads (411, 412, 413, 414, 415, 416, 417, 418) directly get supply from the board through package pins without suffering any IR drop.

A chip implemented using the abovementioned I/O ring and packaging scheme has following advantages:
1. Full compatibility with existing board designs.
2. The chip can support dual board voltage 1.8V for older generation boards and 1.2V for new generation.
3. Cost of redesign and re-fabrication saved when board voltages are reduced.
4. Ability to support two different customers with different board voltages for same application.
5. No IR drop in pass transistor.
6. The abovementioned can also be of use while doing the wafer level testing. If due to some reason the regulator is unable to give correct voltage or its load regulation is not good enough, the core can be still be tested by applying 1.2V supply at 1.2V pads through probe needles. Otherwise the chip would be non-testable.

The present invention is not intended to be restricted to any particular form or arrangement, or any specific embodiment, or any specific use, disclosed herein, and may be modified in various particulars or relations without departing from the spirit or scope of the claimed invention hereinabove shown and described above. The apparatus or methods shown are intended only for illustration and disclosure of an operative embodiment and not to show all of the various forms or modifications in which this invention might be embodied or operated.

What is claimed is:

1. A digital integrated circuit having selectable supply voltage compatibility comprising:
   core logic,
   a core logic supply voltage bus connected to said core logic,
   a low-voltage supply input pad connected to said core logic supply voltage bus,
   one or more digitally switch able ballast devices having an input end connected to a specific high-voltage supply input pad and its output end connected to said core logic supply voltage bus,
   a control block associated with each said ballast device, having a control input connected to said specific high-voltage supply input pad and its output connected to the control input of the corresponding ballast device,
   the arrangement being such that when one of said specific high-voltage supply input pads is connected to the input supply with all other supply input pads being left unconnected, then the corresponding ballast device is enabled and provides a supply voltage reduced to the corelogic operating voltage level to the core logic, while when the input supply is connected to said low-voltage supply input pad and all said specific high-voltage supply input pads are left unconnected then all said ballast devices are disabled and the input supply voltage is directly fed to the core logic supply bus.

2. A digital integrated circuit having selectable supply voltage compatibility as claimed in claim 1, wherein said a weak pullup/pulldown is provided at the control terminal of said control block such that it disables the corresponding ballast devices when said high-voltage supply input pad is left unconnected.

3. A method for providing a selectable supply voltage capability to an integrated circuit, comprising the steps of:
   providing a low-voltage supply input pad directly connected to the internal core logic supply bus,
   providing one or more digitally-switchable ballast devices having an input connected to a specific high-voltage supply input pad and an output connected to the core logic supply,
   providing a control unit associated with each said ballast device having its control input connected to said specific high-voltage supply input pad and its output connected to the control input of said digitally-switched ballast device, and
   connecting the input supply to either a selected one of said specific high-voltage supply input pads when the input supply is higher than the core logic supply voltage or alternatively, feeding the input supply to said low-voltage supply input pad when the input supply is equal to the core logic supply voltage.

4. A circuit comprising:
   a supply terminal;
   at least one first power terminal;
   at least one second power terminal;
   at least one voltage regulator;
   at least one power bus, each of the at least one power bus being coupled to the at least one first power terminal via the at least one voltage regulator and being coupled to the at least one second power terminal; and
   a control circuit arranged to detect, when the circuit is provided power, whether a power supply signal is applied to the supply terminal, to enable the at least one voltage regulator when the power supply signal is applied to the supply terminal, and to disable the at least one voltage regulator when the power supply signal is not applied to the supply terminal.

5. The circuit of claim 4, further comprising logic circuitry powered by power supplied via the at least one first power terminal or the at least one second power terminal.

6. The circuit of claim 4, wherein the control circuit comprises an enable signal input coupled to the supply terminal and coupled to a pull-down circuit, the enable signal input receiving one of the power supply signal or a ground signal based on whether the power supply signal is applied to the supply terminal, and
   wherein the control circuit enables the at least one voltage regulator if the power supply signal is applied to the enable signal input and disables the at least one voltage regulator if the ground signal is applied to the enable signal input.

7. The circuit of claim 4, wherein each of the at least one power bus is connected to one of the at least one voltage regulator and one of the at least one second power terminal.

8. The circuit of claim 4, wherein the at least one power bus is a single power bus connected to each of the at least one voltage regulator and each of the at least one second power terminal.

9. The circuit of claim 4, further comprising a control bus coupled to an output of the control signal and coupled to each of the at least one voltage regulator.

10. The circuit of claim 4, wherein the at least one voltage regulator comprises a ballast transistor.

11. The circuit of claim 4, wherein the supply terminal and the at least one first power terminal are coupled to a source of a 1.8V power supply signal, and the at least one voltage regulator supplies a 1.2V power supply signal to the at least one power bus.

12. The circuit of claim 4, wherein the at least one second power terminal is coupled to a source of a 1.2V power supply signal.

13. The circuit of claim 6, wherein the pull-down circuit comprises a transistor.

14. A method of operating a control circuit to supply power to circuitry, the method comprising:
   while power is being applied to the control circuit:
      determining whether a first power supply signal is applied to a supply terminal; and
      operating the control circuit to, based on a result of the determining:
         when the first power supply signal is applied to the supply terminal, enable at least one voltage regulator to supply a lower-voltage form of the first power supply signal to the circuitry; and
         when the first power supply signal is not applied to the supply terminal, disable the at least one voltage regulator.

15. The method of claim 14, further comprising:
   when the first power supply signal is not applied to the supply terminal, allowing a second power supply signal to be supplied to the circuitry.

16. The method of claim 14, wherein determining whether the first power supply signal is applied to the supply terminal comprises detecting whether the first power supply or a ground signal is applied to an enable signal input of the control circuit.

17. A method of manufacturing an integrated circuit having two possible power supply inputs, the method comprising:
   forming the integrated circuit with a supply terminal for the integrated circuit;
   forming the integrated circuit with at least one first power supply terminal;
   forming the integrated circuit with at least one second power supply terminal;
   forming the integrated circuit with at least one voltage regulator;
   forming the integrated circuit with at least one power bus;
   coupling the at least one first power supply terminal to the at least one power bus via the at least one voltage regulator and coupling the at least one second power supply signal to the at least one power bus; and
   forming the integrated circuit with at least one control circuit having a control signal output coupled to the at least one voltage regulator and having an enable signal input coupled to the supply terminal, the at least one control circuit being arranged to detect, when the integrated circuit is provided power, whether a power supply signal is applied to the supply terminal, to enable the at least one voltage regulator when the power supply signal is applied to the supply terminal, and to disable the at least one voltage regulator when the power supply signal is not applied to the supply terminal.

18. The method of claim 17, further comprising:
   forming the integrated circuit with a pull-down circuit; and
   coupling the pull-down circuit to the enable signal input coupled to the supply terminal.

19. The method of claim 17, wherein forming the integrated circuit with the at least one control circuit comprises forming the integrated circuit with a control circuit adapted to enable the at least one voltage regulator when the enable signal input indicates that a power supply signal is applied to the supply terminal and disable the at least one voltage regulator when the enable signal input does not indicate that the power supply signal is applied to the supply terminal.

* * * * *